US008723573B1

(12) United States Patent
Wang et al.

(10) Patent No.: US 8,723,573 B1
(45) Date of Patent: May 13, 2014

(54) METHOD AND APPARATUS FOR REDUCING CROWBAR CURRENT AND CONTROLLING SLEW RATE

(75) Inventors: Wei Wang, Shanghai (CN); Yumin Zhang, Shanghai (CN)

(73) Assignee: Integrated Device Technology, inc., San Jose, CA (US)

( * ) Notice: Subject to any disclaimer, the term of this patent is extended or adjusted under 35 U.S.C. 154(b) by 15 days.

(21) Appl. No.: 13/528,387

(22) Filed: Jun. 20, 2012

(51) Int. Cl.
*H03K 5/12* (2006.01)

(52) U.S. Cl.
USPC .......................................... 327/170; 327/108

(58) Field of Classification Search
None
See application file for complete search history.

(56) References Cited

U.S. PATENT DOCUMENTS

| 5,696,460 | A | * | 12/1997 | Cameron | ....................... | 327/110 |
| 5,896,696 | A | * | 4/1999 | Stokes et al. | .................... | 43/124 |
| 7,772,878 | B2 | * | 8/2010 | Choi | ................................ | 326/30 |
| 8,402,823 | B2 | * | 3/2013 | Pflum et al. | ...................... | 73/462 |
| 2004/0240275 | A1 | * | 12/2004 | Koo | ......................... | 365/189.05 |

* cited by examiner

*Primary Examiner* — Cassandra Cox

(74) *Attorney, Agent, or Firm* — Kenneth Glass; Molly Sauter; Glass & Associates

(57) ABSTRACT

An output driver that includes a pull-up network comprising a first plurality of resistive branches forming a first R-2R resistive ladder structure, wherein the resistive branches of the pull-up network are coupled to a high voltage supply through pull-up switching transistors. The output driver may further include a pull-down network comprising a second plurality of resistive branches forming a second R-2R resistive ladder structure, wherein the resistive branches of the pull-down network are coupled to a low voltage supply through pull-down switching transistors. The output driver includes a control circuit to selectively activate or deactivate each of the first plurality of resistive branches and to selectively activate or deactivate each of the second plurality of resistive branches.

20 Claims, 5 Drawing Sheets

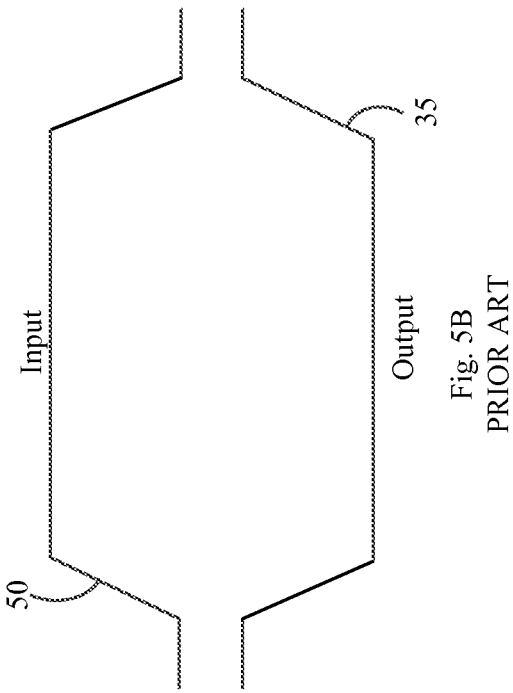
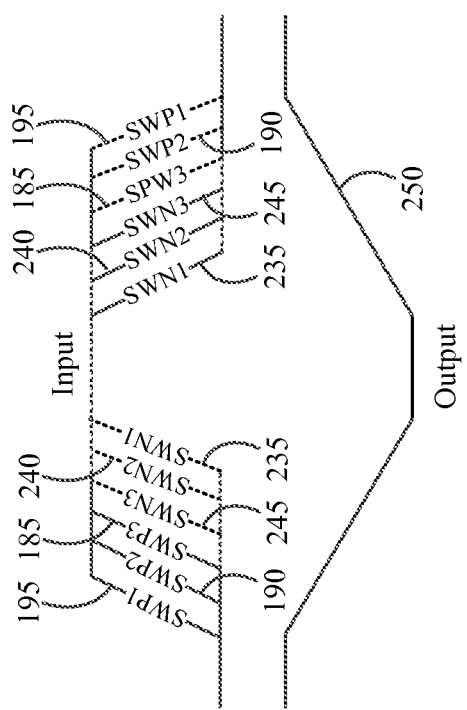

METHOD AND APPARATUS FOR REDUCING CROWBAR CURRENT AND CONTROLLING SLEW RATE

BACKGROUND

Double data rate synchronous dynamic random-access memory (DDR SDRAM) modules are commonly used in high speed memory systems. In DDR memory systems, data is transferred on both the rising and falling edges of the clock signal to achieve approximately twice the bandwidth as compared to a single data rate random-access memory (SDR SDRAM) running at the same clock frequency.

High speed output buffer circuits are commonly used in integrated circuits employing high speed DDR memory systems to provide an output signal to the DDR memory module that is a function of a data input signal from other logic circuitry of the integrated circuit.

With reference to FIG. 1, the output driver 10 of a buffer circuit utilized in a DDR memory module typically utilizes a pull-up transistor 15 and a pull-down transistor 20 connected in series between an internal power supply potential node (VDD) 25 and a ground potential node (GND) 30. The common node 35 between the pull-up transistor 15 and the pull-down transistor 20 is further connected to an output terminal. The output load at the output terminal may be modeled as a resistor RL 40 coupled to output signal node (VTT=(1/2) *VDD) 45, which is commonly used in a DDR system. The output signal 35 at the output terminal 35 is used to drive additional circuitry of the integrated circuit device.

As is commonly known in the art, the driver may consist of complimentary logic transistors, wherein the pull-up transistor 15 may be a PMOS transistor and the pull-down transistor 20 may be an NMOS transistor. In a typical driver 10, the gate of the pull-up transistor 15 and the pull-down transistor 20 are both coupled to the data input or control signal 50. In this configuration, depending upon the logic state of the data input signal (In) 50 to the output buffer circuit 10, either the pull-up transistor 15 or the pull-down transistor 20 is quickly turned ON while the other is turned OFF. In an exemplary embodiment, when the input signal 50 is 0, the transistor Mn 20 is OFF and transistor Mp 15 is ON. When transistor Mp 15 is ON, the driver 10 sources current from VDD 25, Mp 15 and Rp 55 to the output node 35. When the input signal is 1, the transistor Mp 15 is OFF and transistor Mn 20 is ON. When transistor Mn 20 is ON, the driver 10 sinks current from output node 35, Mn 20 and Rn 60 to GND 30.

In a high speed driver 10, such as that used in a DDR system, the data frequency rate is high and therefore the transistors Mp 15 and Mn 20 are rapidly switching ON and OFF. During the rapid ON and OFF of the pull-up transistor 15 and the pull-down transistor 20, there exists a condition in which the pull-up transistor 15 remains ON temporarily as it is being turned OFF, while at the same time, the pull-down transistor 20 is being turned ON. This condition causes a sudden surge of current to flow through the pull-up transistor 15 and the pull-down transistor 20 of the driver 10 from VDD 20 to GND 30. The current generated through the driver when both transistors are temporarily in the ON state is commonly referred to as a crowbar current. The crowbar current is undesirable because it increases the overall power consumption of the driver 10.

In addition to minimizing the crowbar current of the driver 10, it is also desirable to control the output buffer's switching speed, or slew rate. The slew rate of the output driver 10 is equal to the change in output voltage 45 of the driver over time. In a DDR system, it is desirable for the output driver 10 to generate an output signal 45 having a slew rate within a reasonable range to drive the next stage DRAM while still being low enough to minimize reflections and electromagnetic interference (EMI).

Accordingly, what is needed in the art is an output driver having a reduced crowbar current and a controllable slew rate.

SUMMARY

In various embodiments, the output driver of the present invention reduces the crowbar current experienced within the buffer during rapid transitions between complimentary logic states and allows for control over the output slew rate of the driver.

An output driver of the present invention having a reduced crowbar current and a controlled slew rate, may include a pull-up network comprising a first plurality of resistive branches forming a first R-2R resistive ladder structure, wherein each of the first plurality of resistive branches of the pull-up network is coupled to a high voltage supply through one of a plurality of pull-up switching transistors. The output driver may further include, a pull-down network comprising a second plurality of resistive branches forming a second R-2R resistive ladder structure, wherein each of the second plurality of resistive branches of the pull-down network is coupled to a low voltage supply through one of a plurality of pull-down switching transistors. The output driver may further include, a control circuit coupled to a gate of each of the plurality of pull-up switching transistors and pull-down switching transistors, the control circuit to selectively activate or deactivate each of the first plurality of resistive branches through the pull-up switching transistors and to selectively activate or deactivate each of the second plurality of resistive branches through the pull-down switching transistors to reduce the crowbar current of the output driver when switching between complementary logic states.

In operation, a method for reducing a crowbar current and for controlling a slew rate of an output driver during a transition of the output driver between complimentary logic states may include, selectively activating or deactivating each of a first plurality of resistive branches which form a first R-2R resistive ladder structure through one of a plurality of pull-up switching transistors, each of the plurality of pull-up switching transistors coupled to a high voltage supply. The method may further include, selectively activating or deactivating each of a second plurality of resistive branches which form a second R-2R resistive ladder structure through one of a plurality of pull-down switching transistor, each of the plurality of pull-down switching transistors coupled to a low voltage supply.

Selectively activating or deactivating each of a first plurality of resistive branches which form a first R-2R resistive ladder structure through one of a plurality of pull-up switching transistors may further include, identifying the largest current carrying branch of the first plurality of resistive branches which form the first R-2R resistive ladder structure, identifying the smallest current carrying branch of the first plurality of resistive branches which form the first R-2R resistive ladder structure and sequentially deactivating each of the first plurality of resistive branches, beginning with the largest current carrying branch and ending with the smallest current carrying branch.

Selectively activating or deactivating each of a first plurality of resistive branches which form a first R-2R resistive ladder structure through one of a plurality of pull-up switching transistors may further include, identifying the largest current carrying branch of the first plurality of resistive branches which form the first R-2R resistive ladder structure, identifying the smallest current carrying branch of the first plurality of resistive branches which form the first R-2R resistive ladder structure and sequentially activating each of the first plurality of resistive branches, beginning with the smallest current carrying branch and ending with the largest current carrying branch.

Selectively activating or deactivating each of a second plurality of resistive branches which form a second R-2R resistive ladder structure through one of a plurality of pull-down switching transistors may further include, identifying the largest current carrying branch of the second plurality of resistive branches which for the second R-2R resistive ladder structure, identifying the smallest current carrying branch of the second plurality of resistive branches which form the second R-2R resistive ladder structure and sequentially deactivating each of the second plurality of resistive branches, beginning with the largest current carrying branch and ending with the smallest current carrying branch.

Selectively activating or deactivating each of a second plurality of resistive branches which form a second R-2R resistive ladder structure through one of a plurality of pull-down switching transistors may further include, identifying the largest current carrying branch of the second plurality of resistive branches which for the second R-2R resistive ladder structure, identifying the smallest current carrying branch of the second plurality of resistive branches which form the second R-2R resistive ladder structure and sequentially activating each of the second plurality of resistive branches, beginning with the smallest current carrying branch and ending with the largest current carrying branch.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 5 is an illustration of the timing of the switching transistor control signals of the output driver in accordance with an embodiment of the present invention (5A) as compared to the control signals of an output driver currently known in the art (5B).

DETAILED DESCRIPTION

In various embodiments, the output driver of the present invention reduces the crowbar current experienced within the buffer during rapid transitions between complimentary logic states and allows for control over the output slew rate of the driver.

Figure 1:
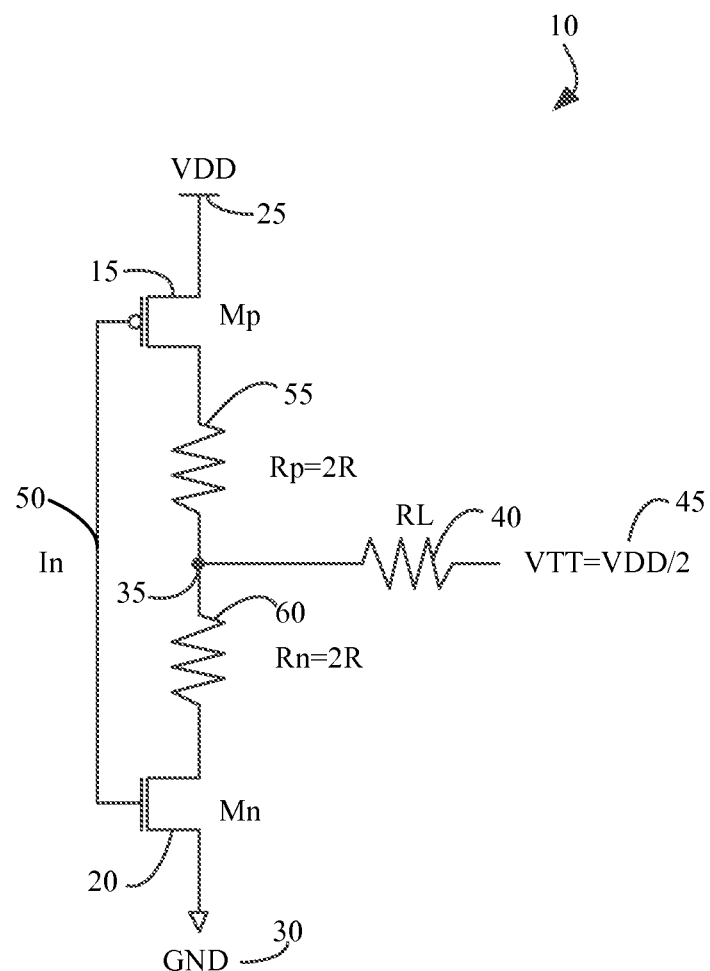
FIG. 1 is a circuit diagram illustrating an output driver implementation known in the prior art.
Figure 2:
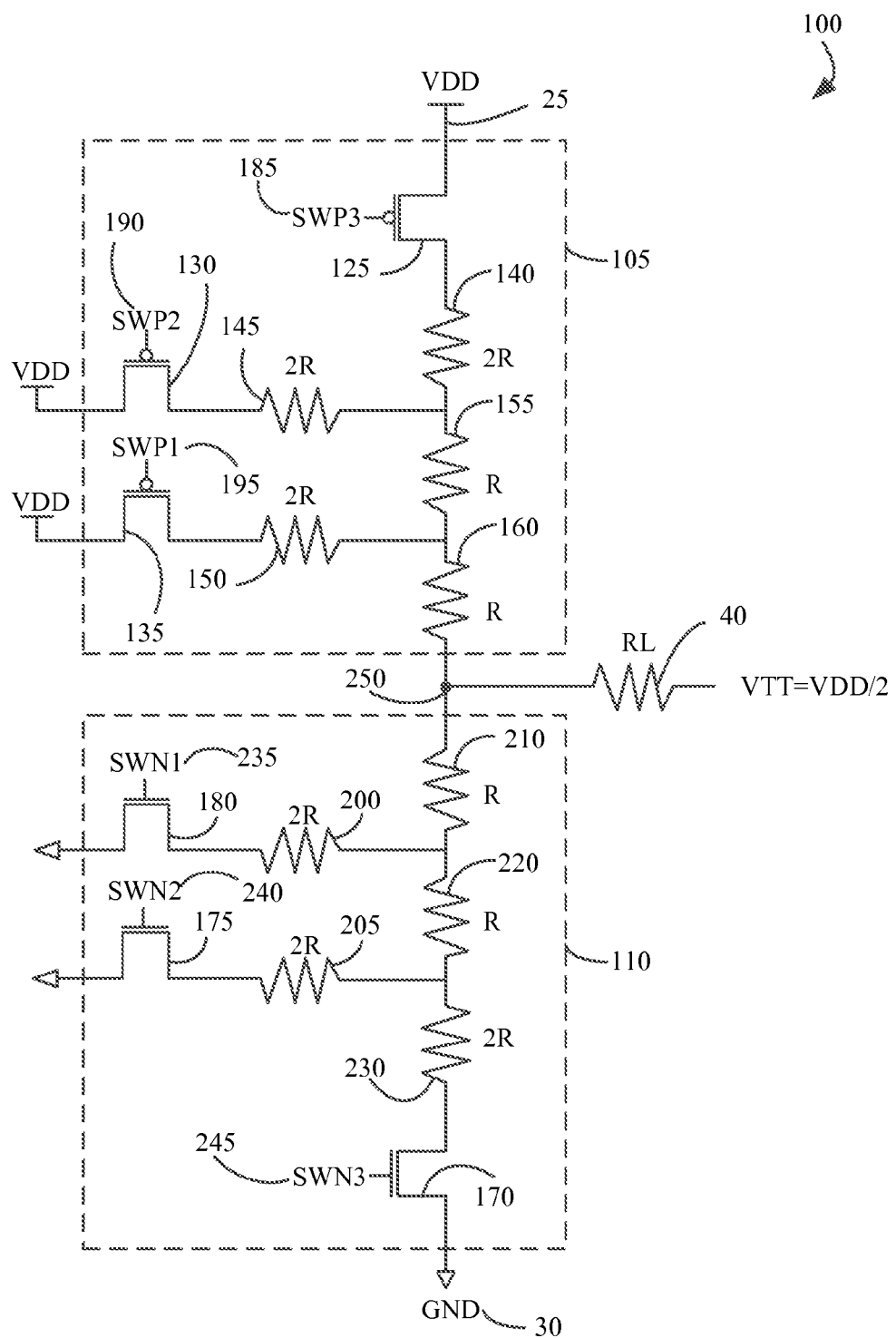
FIG. 2 is a circuit diagram illustrating an output driver in accordance with an embodiment of the present invention.

FIG. 2 illustrates an output driver 100 in accordance with an embodiment of the present invention. In a particular embodiment, the output driver 100 may be implemented within a buffer of a DDR memory device. The DDR buffer may require a constant output driver resistance to drive the next stage in the DDR memory device.

In a particular embodiment, the output driver 100 of the present invention may include a pull-up network 105 comprising a first plurality of resistive branches that form a first R-2R resistive ladder structure. Each of the first plurality of resistive branches of the pull-up network 105 may be coupled between an output load 40 and a high voltage supply 25 through one of a plurality of pull-up switching transistors 125, 130, 135. A control circuit (not shown) may provide a control signal 185, 190, 195 to the gate of each of the plurality of pull-up switching transistors 125, 130, 135. The control signals 185, 190, 195 may be used to selectively activate or deactivate each of the plurality of pull-up switching transistors 125, 130, 135 to reduce the crowbar current and to control the output slew rate of the output driver 100. The output driver 100 may additionally include a pull-down network 110 comprising a second plurality of resistive branches that form a second R-2R resistive ladder structure. Each of the second plurality of resistive branches of the pull-down network 110 may be coupled between an output load 40 and a low voltage supply 30 through one of a plurality of pull-down switching transistors 170, 175, 180. A control circuit (not shown) may provide a control signal 235, 240, 245 to the gate of each of the plurality of pull-down switching transistors 180, 175, 170. The control signals 235, 240, 245 may be used to selectively activate or deactivate each of the plurality of pull-down switching transistors 180, 175, 170 to reduce the crowbar current and to control the output slew rate of the output driver 100.

In a particular embodiment, the pull-up switching transistors 125, 130, 135 and the pull-down switching transistors 170, 175, 180 may be implemented in complementary logic. In a specific embodiment, the pull-up switching transistors 125, 130, 135 may be implemented as PMOS transistors and the pull-down switching transistors 170, 175, 180 may be implemented as NMOS transistors, as is commonly known in CMOS integrated circuits.

In a specific embodiment of the present invention, the pull-up network 105 of the output driver 100 may include three resistive branches forming an R-2R resistive ladder structure. However, it is within the scope of the present invention for the R-2R resistive ladder structure of the pull-up network 105 to include more, or less than, three resistive branches. In an additional embodiment of the present invention, the pull-down network 110 of the output driver 100 may include three resistive branches forming an R-2R resistive ladder structure. However, it is within the scope of the present invention for the R-2R resistive ladder structure of the pull-down network 110 to include more, or less than, three resistive branches.

In the embodiment shown with reference to FIG. 2, the pull-up network 105 of the output driver 100 may include a first pull-up transistor 125 having a source coupled to a high voltage supply 25, a drain coupled to a first terminal of a first resistor 140 and a gate coupled to a first control signal 185 from the control circuit. The pull-up network 105 may further include a second pull-up transistor 130 having a source coupled to the high voltage supply 25, a drain coupled to a first terminal of a second resistor 145 and a gate coupled to a second control signal 190 from the control circuit. The pull-up network 105 may further include a third pull-up transistor 135 having a source coupled to the high voltage supply 25, a drain coupled to a first terminal of a third resistor 150 and a gate coupled to a third control signal 195 from the control circuit. To complete the R-2R resistive ladder structure, the pull-up network 105 may include a fourth resistor 155 having a first terminal coupled to a second terminal of the second resistor 145 and a second terminal coupled to a second terminal of the third resistor 150 and a fifth resistor 160 having a first terminal coupled to the second terminal of the fourth resistor 155 and a second terminal coupled to an output load 40.

In accordance with the R-2R resistive ladder structure, the resistance value of the first resistor 140, the second resistor 145 and the third resistor 150 is twice the resistance value of the fourth resistor 155 and the fifth resistor 160. In this configuration, the total equivalent resistance of the R-2R resistive ladder structure is equal to twice the resistance value of the either the fourth resistor 155 or the fifth resistor 160.

With reference to the embodiment shown in FIG. 2, the pull-down network 110 of the output driver 100 may include three resistive branches forming an R-2R resistive ladder structure. In this embodiment, the pull-down network 110 of the output driver 100 may include a first pull-down transistor 170 having a source coupled to a low voltage supply 30, a drain coupled to a first terminal of a sixth resistor 230 and a gate coupled to a sixth control signal 245 from the control circuit. The pull-down network 110 may further include a second pull-up transistor 175 having a source coupled to the low voltage supply 30, a drain coupled to a first terminal of a seventh resistor 205 and a gate coupled to a seventh control signal 240 from the control circuit. The pull-down network 110 may further include a third pull-down transistor 180 having a source coupled to the low voltage supply 30, a drain coupled to a first terminal of an eighth resistor 200 and a gate coupled to an eighth control signal 235 from the control circuit. To complete the R-2R resistive ladder structure, the pull-down network 105 may include a ninth resistor 220 having a first terminal coupled to a second terminal of the seventh resistor 205 and a second terminal coupled to a second terminal of the eighth resistor 200 and a tenth resistor 210 having a first terminal coupled to the second terminal of the eighth resistor 200 and a second terminal coupled to an output load 40.

In accordance with the R-2R resistive ladder structure, the resistance value of the sixth resistor 230, the seventh resistor 205 and the eighth resistor 200 is twice the resistance value of the ninth resistor 220 and the tenth resistor 210. In this configuration, the total equivalent resistance of the R-2R resistive ladder structure is equal to twice the resistance value of the either the ninth resistor 220 or the tenth resistor 210.

In operation, assuming that the control signals 185, 190 and 195 for the pull-up network 105 and the control signals 235, 240 and 245 for the pull-down network 110 are all at a logic low, it follows that pull-down switching transistors 170, 175 and 180 are turned OFF and the pull-down resistance from the output node 250 to the low voltage supply 30 is essentially infinite. Additionally, with all of the control signals being held at a logic low, the pull-up switching transistors 125, 130 and 135 are turned ON and, ignoring the on-resistance of the pull-up switching transistors 125, 130 and 135, the current distribution through the pull-up network 105 is as illustrated in FIG. 3A.

Figures 3A, 3B:
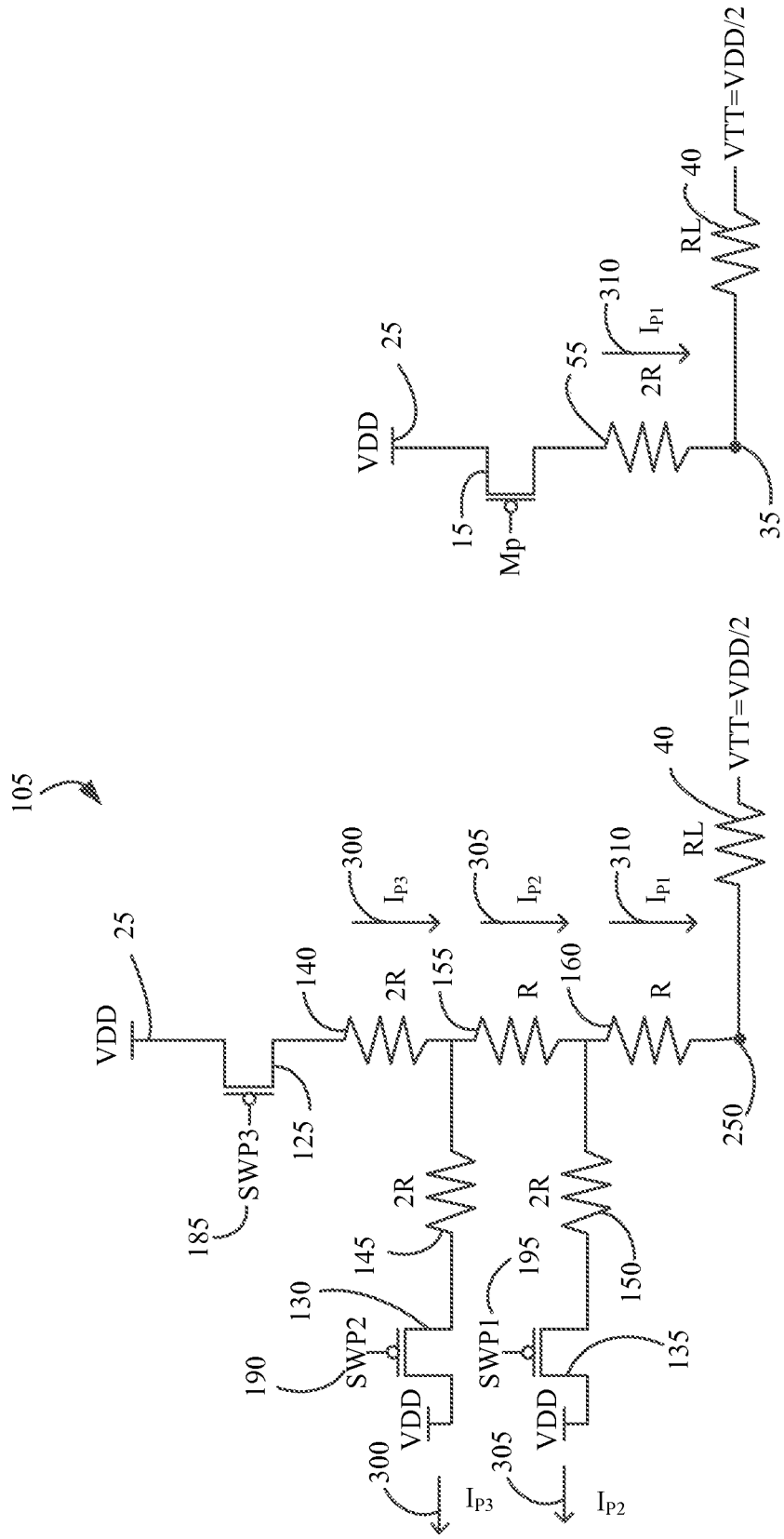
FIG. 3A is a circuit diagram illustrating a pull-up network of an output driver in accordance with an embodiment of the present invention.
FIG. 3B is a circuit diagram a pull-up network currently known in the art.

As shown in FIG. 3A, when the pull-up switching transistors 125, 130 and 135 are operating in the ON state, the output driver 100 sources current from the high voltage supply 25. In this configuration, the current 300 through flowing through the first resistor 140 is equal to half of the current 305 flowing through the fourth resistor 155, which is equal to one fourth of the current 310 flowing through the fifth resistor 160. Since the equivalent resistance of the R-2R resistive ladder structure is equal to 2 R, is follows that the current distribution through the R-2R resistive ladder structure of the pull-up network 105 is equal to the current 310 flowing through an output driver as known in the prior art having an internal resistance of 2 R as shown in FIG. 3B. As such, the current flowing through the resistive branch controlled by the third pull-up switching transistor 135 is greater than the current flowing through the resistive branch controlled by the second pull-up switching transistor 130, which is greater than the current flowing through the resistive branch controlled by the first pull-up switching transistor 125. By implementing a R-2R resistive ladder structure into the output driver 100, the control signals 185, 190 and 195 of the pull-up transistors 125, 130 and 135 may be used to selectively active or deactivate the resistive branches of the R-2R resistive ladder structure, thereby controlling the current distribution through the pull-up network 105 during transitions between complimentary logic states.

Figures 4A, 4B:
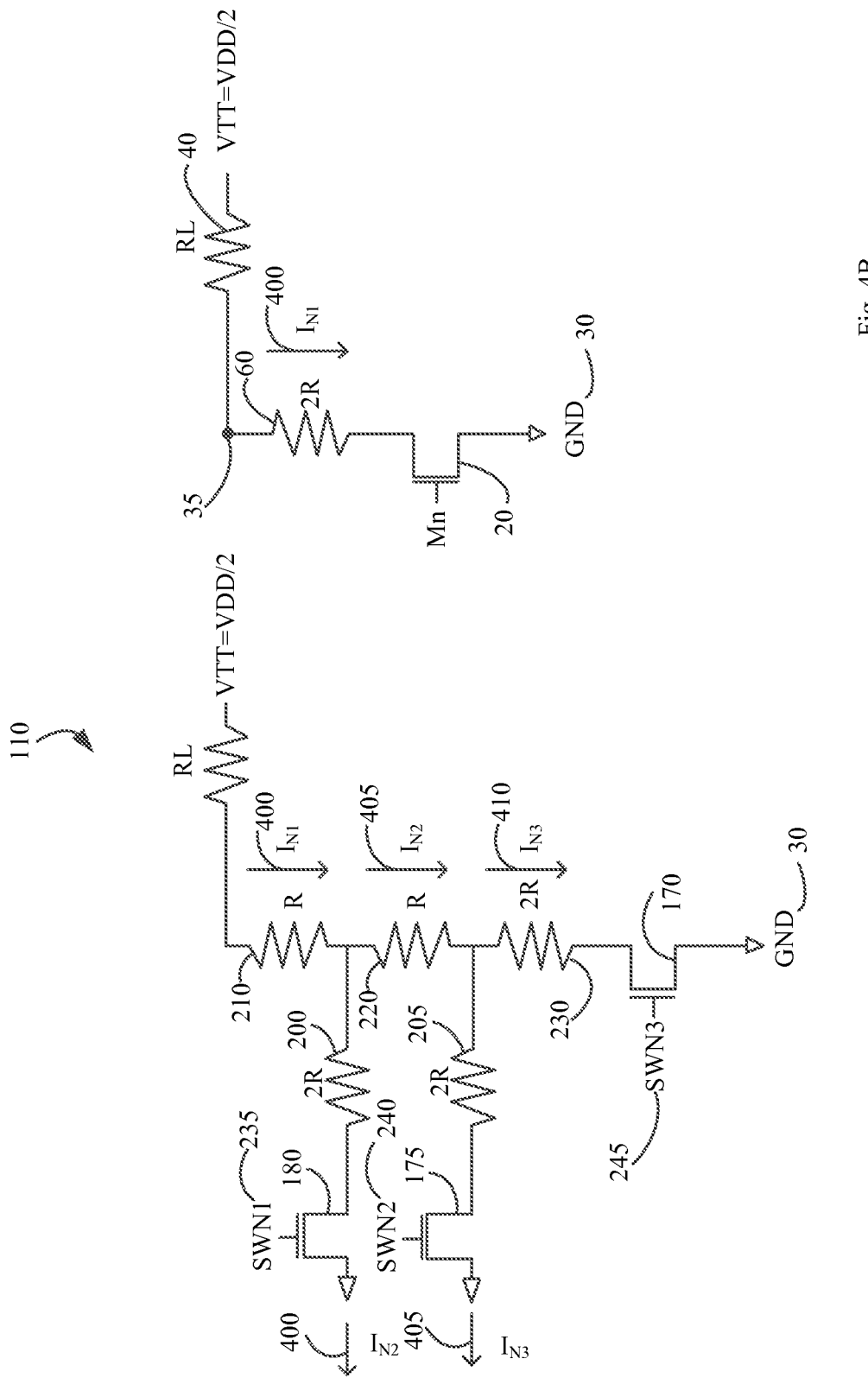
FIG. 4A is a circuit diagram illustrating a pull-down network of an output driver in accordance with an embodiment of the present invention.
FIG. 4B is a circuit diagram illustrating a pull-up network currently known in the art.

Additionally, in the complimentary state, when all the control signals are held at a logic high, the pull-down switching transistors 170, 175 and 180 are turned ON and, ignoring the on-resistance of the pull-down switching transistors 170, 175 and 180, the current distribution through the pull-up network 110 is illustrated in FIG. 4A.

As shown in FIG. 4A, when pull-down switching transistors 170, 175 and 180 are operating in the ON state, the output driver 100 sources current from the low voltage supply 30. In this configuration, the current 410 through flowing through the sixth resistor 230 is equal to half of the current 405 flowing through the ninth resistor 220, which is equal to one fourth of the current 400 flowing through the tenth resistor 210. Since the equivalent resistance of the R-2R resistive ladder structure is equal to 2 R, is follows that the current distribution through the R-2R resistive ladder structure of the pull-down network 110 is equal to the current 400 flowing through an output driver as known in the prior art having an internal resistance of 2 R as shown in FIG. 4B. As such, the current flowing through the resistive branch controlled by the first pull-down switching transistor 180 is greater than the current flowing through the resistive branch controlled by the second pull-down switching transistor 175, which is greater than the current flowing through the resistive branch controlled by the third pull-down switching transistor 170. By implementing an R-2R resistive ladder structure into the output driver 100, the control signals 235, 240 and 245 of the pull-down transistors 180, 175 and 170 may be used to selectively active or deactivate the resistive branches of the R-2R resistive ladder structure, thereby controlling the current distribution through the pull-up network 110 during transitions between complimentary logic states.

In a specific embodiment, the pull-up transistors may be implemented as PMOS transistors and the pull-down transistors may be implemented as NMOS transistors.

In an exemplary embodiment, it is assumed that all of the control signals 185, 190, 195, 235, 240 and 245 are initially held at a low logic level and the output of the driver 100 is therefore at a logic high level. In this embodiment, in order to reduce the crowbar current between the high voltage supply 25 and the low voltage supply 30 that may occur when switching the logic state of the output of the driver 100 to a low logic level, the resistive branches of the pull-up network 105 and the pull-down network 110 may be sequentially activated and deactivated.

In this exemplary embodiment, the PMOS transistors 125, 130, 135 are first turned OFF by changing the control signals 185, 190 and 195 at the gate of the PMOS transistors 125, 130, 135 to a logic high level and then the NMOS transistors 170, 175, 180 are turned ON by changing the control signals 235, 240, 245 at the gate of the NMOS transistors 180, 175, 170 to a logic low level. By turning OFF the PMOS transistors, prior to turning ON the NMOS transistors, the crowbar current can be reduced by essentially eliminating the possibility that the PMOS transistors may remain ON while the NMOS transistors are being turned ON. Unlike the output drivers currently known in the art, the gates of the PMOS and NMOS transistors of the present invention are not connected together and as such, the present invention allows the PMOS transistors to be turned OFF prior to turning ON the NMOS transistors.

In a specific embodiment, the PMOS transistors 125, 130, 135 may be turned OFF in a particular sequence and the NMOS transistors 170, 175, 180 may be turned ON in a particular sequence to change the output from a logic high to a logic low. In this embodiment, the PMOS transistor associated with the largest current carrying resistive branch of the R-2R resistive ladder structure is turned OFF first, followed by the second largest current carrying resistive branch of the R-2R resistive ladder structure and finally the smallest current carrying resistive branch of the R-2R resistive ladder is turned OFF last. As previously identified with reference to FIG. 3, the third PMOS transistor 135 of the pull-up network is associated with the largest current carrying resistive branch of the R-2R resistive ladder structure. As such, the third PMOS transistor 135 is turned OFF first, thereby deactivating the largest current carrying resistive branch of the R-2R resistive ladder structure. Next, the second PMOS transistor 130 is turned OFF to deactivate the second largest current carrying branch and finally the first PMOS transistor 125 is turned OFF to deactivate the smallest current carrying branch of the R-2R resistive ladder structure. By selectively deactivating the resistive branches of the R-2R resistive structure utilizing the PMOS transistors based upon the value of the current flow through the resistive branches, the total current flowing from the high voltage supply to the low voltage supply can be minimized. Turning OFF the largest current carrying resistive branches utilizing the third PMOS transistor 135 and the second PMOS transistor 130 results in a weak conducting current remaining in the first PMOS transistor 125 and a greater total resistance between the high voltage supply 25 and the low voltage supply 30, thereby reducing the crowbar current of the output driver 100.

After the PMOS transistors have been turned OFF, the NMOS transistors may be sequentially turned ON. However, when turning ON the NMOS transistors, it is advantageous to turn ON the NMOS transistor associated with the smallest current carrying resistive branch of the R-2R resistive ladder structure first, followed by the second smaller current carrying resistive branch of the R-2R resistive ladder structure and finally the largest current carrying resistive branch of the R-2R resistive ladder is turned ON last. As previously identified with reference to FIG. 4, the first NMOS transistor 170 of the pull-down network is associated with the smallest current carrying resistive branch of the R-2R resistive ladder structure. As such, the first NMOS transistor 170 is turned ON first, thereby activating the smallest current carrying resistive branch of the R-2R resistive ladder structure. Next, the second NMOS transistor 175 is turned ON to activate the second smallest current carrying branch and finally the third NMOS transistor 180 is turned ON to activate the largest current carrying branch of the R-2R resistive ladder structure. By selectively activating the resistive branches of the R-2R resistive structure utilizing the NMOS transistors based upon the value of the current flow through the resistive branches, the total current flowing from the high voltage supply to the low voltage supply can be minimized. Turning ON the smallest current carrying resistive branches utilizing the first NMOS transistor 170 and the second NMOS transistor 175 results in a weak conducting current remaining in the third NMOS transistor 180 and a greater total resistance between the high voltage supply 25 and the low voltage supply 30, thereby reducing the crowbar current of the output driver 100.

While gradually turning OFF the PMOS transistors and gradually turning ON the NMOS transistors, the current relationship at the switching instant may not be accurately identified as IP3=(1/2)*IP2=(1/4)*IP1 or IN3=(1/2)*IN2=(1/4)*IN1, as proven with reference to FIG. 3 and FIG. 4. However, as long as the selective activation and deactivate of the transistors satisfies the relationship IP3<IP2<IP1 and IN3<IN2<IN1, then the potential crowbar current will be minimized.

In an additional exemplary embodiment illustrating the complimentary logic of the previous exemplary embodiment, it is assumed that all of the control signals 185, 190, 195, 235, 240 and 245 are initially held at a high logic level and the output of the driver 100 is therefore at a low level. In this embodiment, the NMOS transistors 170, 175, 180 are initially ON and the PMOS transistors 125, 130, 135 are initially OFF. In order to reduce the crowbar current between the high voltage supply 25 and the low voltage supply 30 that may occur when switching the logic state of the output of the driver 100 to a high logic level, the resistive branches of the pull-up network 105 and the pull-down network 110 may be sequentially activated and deactivated.

In this additional exemplary embodiment, the NMOS transistors 180, 175, 170 are first turned OFF by changing the control signals 235, 240, 245 at the gate of the NMOS transistors 180, 175, 170 to a logic low level, and then the PMOS transistors 125, 130, 135 are turned ON by changing the control signals 185, 190 and 195 at the gate of the PMOS transistors 125, 130, 135 to a logic low level. By turning OFF the NMOS transistors, prior to turning ON the PMOS transistors, the crowbar current can be reduced by essentially eliminating the possibility that the NMOS transistors may remain ON while the PMOS transistors are being turned ON. Unlike the output drivers currently known in the art, the gates of the PMOS and NMOS transistors of the present invention are not connected together and as such, the present invention allows the NMOS transistors to be turned OFF prior to turning ON the PMOS transistors.

In a specific embodiment, the NMOS transistors 170, 175, 180 may be turned OFF in a particular sequence and the PMOS transistors 125, 130, 135 may be turned ON in a particular sequence to change the output from a logic low to a logic high. In this embodiment, the NMOS transistor associated with the largest current carrying resistive branch of the R-2R resistive ladder structure is turned OFF first, followed by the second largest current carrying resistive branch of the R-2R resistive ladder structure and finally the smallest current carrying resistive branch of the R-2R resistive ladder is turned OFF last. As previously identified with reference to FIG. 4, the third NMOS transistor 180 of the pull-down network is associated with the largest current carrying resistive branch of the R-2R resistive ladder structure. As such, the third NMOS transistor 180 is turned OFF first, thereby deactivating the largest current carrying resistive branch of the R-2R resistive ladder structure. Next, the second NMOS transistor 175 is turned OFF to deactivate the second largest current carrying branch and finally the first NMOS transistor 170 is turned OFF to deactivate the smallest current carrying branch of the R-2R resistive ladder structure. By selectively deactivating the resistive branches of the R-2R resistive structure utilizing the NMOS transistors based upon the value of the current flow through the resistive branches, the total current flowing from the high voltage supply to the low voltage supply can be minimized. Turning OFF the largest current carrying resistive branches utilizing the third NMOS transistor 180 and the second NMOS transistor 175 results in a weak conducting current remaining in the first NMOS transistor 170 and a greater total resistance between the high voltage supply 25 and the low voltage supply 30, thereby reducing the crowbar current of the output driver 100.

After the NMOS transistors have been turned OFF, the PMOS transistors may be sequentially turned ON. However, when turning ON the PMOS transistors, it is advantageous to turn ON the PMOS transistor associated with the smallest current carrying resistive branch of the R-2R resistive ladder structure first, followed by the second smaller current carrying resistive branch of the R-2R resistive ladder structure and finally the largest current carrying resistive branch of the R-2R resistive ladder is turned ON last. As previously identified with reference to FIG. 3, the first PMOS transistor 125 of the pull-up network is associated with the smallest current carrying resistive branch of the R-2R resistive ladder structure. As such, the first PMOS transistor 125 is turned ON first, thereby activating the smallest current carrying resistive branch of the R-2R resistive ladder structure first. Next, the second PMOS transistor 130 is turned ON to activate the second smallest current carrying branch and finally the third PMOS transistor 135 is turned ON to activate the smallest current carrying branch of the R-2R resistive ladder structure. By selectively activating the resistive branches of the R-2R resistive structure utilizing the PMOS transistors based upon the value of the current flow through the resistive branches, the total current flowing between the high voltage supply to the low voltage supply can be minimized. Turning ON the smallest current carrying resistive branches utilizing the first PMOS transistor 125 and the second PMOS transistor 130 results in a weak conducting current remaining in the third PMOS transistor 135 and a greater total resistance between the high voltage supply 25 and the low voltage supply 30, thereby reducing the crowbar current of the output driver 100.

While gradually turning OFF the NMOS transistors and gradually turning ON the PMOS transistors, the current relationship at the switching instant may not be accurately identified as $IP3=(1/2)*IP2=(1/4)*IP1$ or $IN3=(1/2)*IN2=(1/4)*IN1$, as proven with reference to FIG. 3 and FIG. 4. However, as long as the selective activation and deactivate of the transistors satisfies the relationship $IP3<IP2<IP1$ and $IN3<IN2<IN1$, then the potential crowbar current will be minimized.

In addition to reducing the crowbar current of the output driver 100, the output driver slew rate may be controlled through the implementation of the above described methods.

With reference to FIG. 5, the control signals 185, 190, 195, 235, 240, 245 and the associated output waveform 250 of the output driver 100 of the present invention are illustrated in FIG. 5A and the control signal 50 and associated output waveform 35 in accordance with a prior art output driver are illustrated in FIG. 5B.

As in shown in FIG. 5B, the output waveform 35 of the prior art output driver is dependent upon only a signal input waveform 50 and the output waveform 35, and hence the slew rate of the output driver, is essentially the compliment of the input waveform 50.

In contrast, in accordance with the present invention, the delay of time between each of the control signals 185, 190, 195, 235, 240, 245 comprising the input signal waveform allows for adjustment of the output waveform and the corresponding slew rate of the output driver.

In an exemplary embodiment for controlling the output driver slew rate, assuming that the control signals 185, 190, 195, 235, 240, 245 comprising the input signal waveform to the output driver 100 are initially held at a high logic level. With this assumption, the NMOS transistors 170, 175, 180 are initially ON and the PMOS transistors 125, 130, 135 are initially OFF. Referring to FIG. 5, with the control signals 185, 190, 195, 235, 240, 245 held at a high logic level, the output of the driver is $[2 R/(2R+RL)]*VTT=[2 R/(2R+RL)]*VDD/2$. Following the method of the present invention as previously described for switching the output of the driver from a low logic level to a high logic level, the third NMOS transistor 180 is turned OFF first using control signal 235. After the third NMOS transistor 180 has been turned OFF, the downside resistance increases from 2 R to 3 R and the output of the driver rises to $[3 R/(3 R+RL)]*VDD/2$. Next, the second NMOS transistor 175 is turned OFF using control signal 240, resulting in a downside resistance of 4 R and an output voltage of $[4 R/(4 R+RL)]*VDD/2$. The first NMOS transistor 170 is then turned OFF using control signal 245, resulting in an infinite downside impedance and an output voltage of $VTT=VDD/2$.

After all the NMOS transistors have been turned OFF, the first PMOS transistor 125 is turned ON using control signal 185, resulting in an upside resistance of 4 R and an output voltage of $[RL/(4 R+RL)]*(VDD-VTT)+VTT=[RL/(4 R+RL)]*(VDD/2)+(VDD/2)$. Next, the second PMOS transistor 130 is turned ON using control signal 190, resulting in an upside resistance of 3 R and an output voltage of $[RL/(3 R+RL)]*(VDD-VTT)+VTT=[RL/(3 R+RL)]*(VDD/2)+(VDD/2)$. Finally, the third PMOS transistor 135 is turned ON using control signal 195, resulting in an upside resistance of 2 R and an output voltage of $[RL/(2R+RL)]*(VDD-VTT)+VTT=[RL/(2R+RL)]*(VDD/2)+(VDD/2)$. As such, in accordance with the present invention, the output voltage of the output driver 100 changes dependent upon the state of the NMOS transistors and the PMOS transistors of the output driver 100. Since there are multiple input control signals used to switch the output of the driver 100, the rise and fall time of the output of the driver will be increased and the slew-rate will be reduced. By controlling the time delay between the applications of the control signals, the output driver 100 can maintain a required slew rate and EMI.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An output driver having a reduced crowbar current and a controlled slew rate, the output driver comprising:
   a pull-up network comprising a first plurality of resistive branches forming a first R-2R resistive ladder structure, wherein each of the first plurality of resistive branches of the pull-up network is coupled to a high voltage supply through one of a plurality of pull-up switching transistors;
   a pull-down network comprising a second plurality of resistive branches forming a second R-2R resistive ladder structure, wherein each of the second plurality of resistive branches of the pull-down network is coupled to a low voltage supply through one of a plurality of pull-down switching transistors; and a control circuit coupled to a gate of each of the plurality of pull-up switching transistors and pull-down switching transistors, the control circuit to selectively activate or deactivate each of the first plurality of resistive branches through the pull-up switching transistors and to selectively activate or deactivate each of the second plurality of resistive branches through the pull-down switching transistors to reduce the crowbar current of the output driver when switching between complementary logic states.

2. The output driver of claim 1, wherein the pull-up network further comprises:
a first pull-up transistor having a source coupled to the high voltage supply, a drain coupled to a first terminal of a first resistor and a gate coupled to a first control signal of the control circuit;
a second pull-up transistor having a source coupled to the high voltage supply, a drain coupled to a first terminal of a second resistor and a gate coupled to a second control signal of the control circuit;
a third pull-up transistor having a source coupled to the high voltage supply, a drain coupled to a first terminal of a third resistor and a gate coupled to a third control signal of the control circuit;
a fourth resistor having a first terminal coupled to a second terminal of the second resistor and a second terminal coupled to a second terminal of the third resistor; and
a fifth resistor having a first terminal coupled to the second terminal of the fourth resistor and a second terminal coupled to an output load.

3. The output driver of claim 2, wherein a resistance of the first resistor is equal to a resistance of the second resistor and a resistance of the third resistor.

4. The output driver of claim 2, wherein a resistance of the fourth resistor is equal to a resistance of the fifth resistor.

5. The output driver of claim 1, wherein the pull-down network further comprises:
a first pull-down transistor having a source coupled to the low voltage supply, a drain coupled to a first terminal of a sixth resistor and a gate coupled to a fourth control signal of the control circuit;
a second pull-down transistor having a source coupled to the low voltage supply, a drain coupled to a first terminal of a seventh resistor and a gate coupled to a fifth control signal of the control circuit;
a third pull-down transistor having a source coupled to the low voltage supply, a drain coupled to a first terminal of an eighth resistor and a gate coupled to a sixth control signal of the control circuit;
a ninth resistor having a first terminal coupled to a second terminal of the seventh resistor and a second terminal coupled to a second terminal of the eighth resistor; and
a tenth resistor having a first terminal coupled to the second terminal of the eighth resistor and a second terminal coupled to an output load.

6. The output driver of claim 5, wherein a resistance of the sixth resistor is equal to a resistance of the seventh resistor and a resistance of the eighth resistor.

7. The output driver of claim 5, wherein a resistance of the ninth resistor is equal to a resistance of the tenth resistor.

8. The output driver of claim 1, wherein the output driver is a double data rate (DDR) buffer output driver.

9. An output driver having a reduced crowbar current and a controlled slew rate, the output driver comprising:
a first pull-up transistor having a source coupled to the high voltage supply, a drain coupled to a first terminal of a first resistor and a gate coupled to a first control signal of the control circuit;
a second pull-up transistor having a source coupled to the high voltage supply, a drain coupled to a first terminal of a second resistor and a gate coupled to a second control signal of the control circuit, a second terminal of the second resistor coupled to a second terminal of the first resistor;
a third pull-up transistor having a source coupled to the high voltage supply, a drain coupled to a first terminal of a third resistor and a gate coupled to a third control signal of the control circuit;
a fourth resistor having a first terminal coupled to the second terminal of the second resistor and a second terminal coupled to a second terminal of the third resistor;
a fifth resistor having a first terminal coupled to the second terminal of the fourth resistor and a second terminal coupled to an output load;
a first pull-down transistor having a source coupled to the low voltage supply, a drain coupled to a first terminal of a sixth resistor and a gate coupled to a fourth control signal of the control circuit;
a second pull-down transistor having a source coupled to the low voltage supply, a drain coupled to a first terminal of a seventh resistor and a gate coupled to a fifth control signal of the control circuit, a second terminal of the seventh resistor coupled to a second terminal of the sixth resistor;
a third pull-down transistor having a source coupled to the low voltage supply, a drain coupled to a first terminal of an eighth resistor and a gate coupled to a sixth control signal of the control circuit;
a ninth resistor having a first terminal coupled to the second terminal of the seventh resistor and a second terminal coupled to a second terminal of the eighth resistor; and
a tenth resistor having a first terminal coupled to the second terminal of the eighth resistor and a second terminal coupled to an output load.

10. The output driver of claim 9, wherein a resistance of the first resistor is equal to a resistance of the second resistor and a resistance of the third resistor.

11. The output driver of claim 9, wherein a resistance of the fourth resistor is equal to a resistance of the fifth resistor.

12. The output driver of claim 9, wherein a resistance of the sixth resistor is equal to a resistance of the seventh resistor and a resistance of the eighth resistor.

13. The output driver of claim 9, wherein a resistance of the ninth resistor is equal to a resistance of the tenth resistor.

14. The output driver of claim 9, wherein the output driver is a double data rate (DDR) output driver.

15. A method for reducing a crowbar current and for controlling a slew rate of an output driver during a transition of the output driver between complimentary logic states, the method comprising:
selectively activating or deactivating each of a first plurality of resistive branches which form a first R-2R resistive ladder structure through one of a plurality of pull-up switching transistors, each of the plurality of pull-up switching transistors coupled to a high voltage supply; and
selectively activating or deactivating each of a second plurality of resistive branches which form a second R-2R resistive ladder structure through one of a plurality of pull-down switching transistors, each of the plurality of pull-down switching transistors coupled to a low voltage supply.

16. The method of claim 15, wherein selectively activating or deactivating each of a first plurality of resistive branches which form a first R-2R resistive ladder structure through one of a plurality of pull-up switching transistors, further comprises:
- identifying the largest current carrying branch of the first plurality of resistive branches which for the first R-2R resistive ladder structure;
- identifying the smallest current carrying branch of the first plurality of resistive branches which form the first R-2R resistive ladder structure; and
- sequentially deactivating each of the first plurality of resistive branches, beginning with the largest current carrying branch and ending with the smallest current carrying branch.

17. The method of claim 15, wherein selectively activating or deactivating each of a first plurality of resistive branches which form a first R-2R resistive ladder structure through one of a plurality of pull-up switching transistors, further comprises:
- identifying the largest current carrying branch of the first plurality of resistive branches which form the first R-2R resistive ladder structure;
- identifying the smallest current carrying branch of the first plurality of resistive branches which form the first R-2R resistive ladder structure; and
- sequentially activating each of the first plurality of resistive branches, beginning with the smallest current carrying branch and ending with the largest current carrying branch.

18. The method of claim 15, wherein selectively activating or deactivating each of a second plurality of resistive branches which form a second R-2R resistive ladder structure through one of a plurality of pull-down switching transistors, further comprises:
- identifying the largest current carrying branch of the second plurality of resistive branches which for the second R-2R resistive ladder structure;
- identifying the smallest current carrying branch of the second plurality of resistive branches which form the second R-2R resistive ladder structure; and
- sequentially deactivating each of the second plurality of resistive branches, beginning with the largest current carrying branch and ending with the smallest current carrying branch.

19. The method of claim 15, wherein selectively activating or deactivating each of a second plurality of resistive branches which form a second R-2R resistive ladder structure through one of a plurality of pull-down switching transistors, further comprises:
- identifying the largest current carrying branch of the second plurality of resistive branches which for the second R-2R resistive ladder structure;
- identifying the smallest current carrying branch of the second plurality of resistive branches which form the second R-2R resistive ladder structure; and
- sequentially activating each of the second plurality of resistive branches, beginning with the smallest current carrying branch and ending with the largest current carrying branch.

20. The method of claim 15, further comprising controlling a time delay for the selectively activating and deactivating of the first plurality of resistive branches and the second plurality of resistive branches to control a slew rate of the output driver.

\* \* \* \* \*